(12) United States Patent
Cao et al.

(10) Patent No.: US 6,784,727 B1
(45) Date of Patent: Aug. 31, 2004

(54) FAST-SETTLING DC OFFSET REMOVAL CIRCUITS WITH CONTINUOUS CUTOFF FREQUENCY SWITCHING

(75) Inventors: Kanyu Cao, Cupertino, CA (US);
Tung-Shan Chen, Milpitas, CA (US);
Hongyu Li, Cupertino, CA (US);
Chieh-Yuan Chao, Fremont, CA (US)

(73) Assignee: Hyperband Communication, Inc., Milpitas, CA (US)

( * ) Notice: Subject to any disclaimer, the term of this patent is extended or adjusted under 35 U.S.C. 154(b) by 0 days.

(21) Appl. No.: 10/443,178

(22) Filed: May 21, 2003

(51) Int. Cl.[7] .................................................. H03B 1/00
(52) U.S. Cl. ..................................................... 327/553
(58) Field of Search .............................. 327/551, 552, 327/553, 554, 558

(56) References Cited

U.S. PATENT DOCUMENTS

| | | | | |
|---|---|---|---|---|
| 5,208,693 A | * | 5/1993 | Arstein et al. ............... | 398/100 |
| 6,583,746 B2 | * | 6/2003 | Tokioka ....................... | 341/155 |
| 6,611,167 B2 | * | 8/2003 | McMahon et al. .......... | 327/538 |

OTHER PUBLICATIONS

Peter M. Stroet, A Zero–IF Single Chip Transceiver for up to 22Mb/s QPSK 802.11b Wireless LAN. 2001 Digest of Technical Papers of IEEE International Solid–State Circuits Conference (ISSCC '01), 2001.

Peter M. Stroet, A Zero–IF Single Chip Transceiver for up to 22Mb/s QPSK 802.11b Wireless LAN. 2001 Visual Supplement of Technical Papers of IEEE International Solid–State Circuits Conference (ISSCC '01), 2001.

* cited by examiner

*Primary Examiner*—Jeffrey Zweizig
(74) *Attorney, Agent, or Firm*—Law Offices of Emil Chang; Emil Chang

(57) ABSTRACT

A fast-setting DC offset removal circuit with continuous cutoff frequency switching is disclosed. In the preferred embodiment, the circuit is implemented using a pair of RC filters for receiving a differential signal pair and a continuous, variable resistance control circuit. The control circuit can be current-controlled or voltage controlled to provide fast settling of the received signal and the removal of the DC offset components. Additionally, by using a current-controlled control circuit, the cutoff frequency of the RC filter can be ramped from high to low in a continuous manner, thereby minimizing the generation of DC offsets.

12 Claims, 5 Drawing Sheets

FAST-SETTLING DC OFFSET REMOVAL CIRCUITS WITH CONTINUOUS CUTOFF FREQUENCY SWITCHING

FIELD OF INVENTION

The present invention generally relates to circuits for signal alignment and, in particular, circuits for fast-settling signal alignment and DC offset removal.

BACKGROUND

In the processing a received signal, it is desirable to quickly settle the received signal in order to process the signal. However, an unintended DC offset component may have been introduced to the received signal from a variety of sources as the signal is transmitted in stream or processed by the circuitry. The resulting distorted signal would be difficult to decode, would cause further complications, and generates undesirable effects to the downstream circuitry. Thus, the removal of this undesirable DC offset component, along with the quickly settling of the received signal, becomes important issues in many applications.

For example, zero-intermediate-frequency (Zero-IF) architectures have become very popular in analog base band circuits for radio frequency (RF) receivers due to its lower requirements on channel select filters and amplifiers. This type of architecture demands that the received signal be processed at low frequencies with amplitudes that are very close to zero. Hence, the removal of undesirable DC offset generated by, for example, mismatch, local oscillator (LO) leakage, or self-mixing becomes a critical issue.

In the prior art, many transceivers use calibration techniques to remove the DC offset. Although calibration techniques can effectively remove DC offset caused by mismatch and LO leakage, DC offset caused by self-mixing of a strong interferer and other operation-dependent sources can not be easily predicted and canceled. Calibration techniques also considerably increase circuit complexity and require close collaboration between analog and digital receiver chips.

Another method for DC offset removal is the insertion of a simple RC filter, as is illustrated in FIG. 1, which utilizes a capacitor to block DC voltage level and a resistor to provide DC bias for the following circuits. Cut-off frequency of this RC circuit should be small enough to reduce attenuation of signal intensity and group delay and be large enough to be able to settle to near asymptotic state within a required time that is specified by the standard. For example, in the IEEE802.11 standards for wireless local area network (WLAN) applications, cut-off frequency of less than 10 KHz is desired. A naive implementation of this circuit with frequency this low would take hundreds of microseconds to settle. However, the standard also requires DC offset cancellation circuit to settle within a period of 800 nS, three orders of magnitude lower. Previous works by others have implemented switchable RC filters that can switch cut-off frequency from high to low in three or more discrete steps. This method cannot reliably settle because the discrete switching action itself will generate a DC offset depending on the signal levels at the input and at the output at the switching instant. The fundamental reason of switching-induced DC offset will be explained in more details later in this disclosure.

In analyzing a simple RC filter as illustrated in FIG. 1, a differential equation can be derived to describe the filter's behavior in the time domain.

$$C\frac{d(V_{out} - V_{in})}{dt} = -\frac{V_{out}}{R} \tag{1}$$

With the initial condition $$V_{out}|_{t=0} = V_0 \tag{2}$$

The solution is $$V_{out} = \frac{\int_0^t p(t')\frac{dV_{in}(t')}{dt'}dt' + V_0}{p(t)}, \quad p(t) = e^{\int_0^t (RC)^{-1}dt'} \tag{3}$$

Define cutoff frequency $f_T$ to be:

$$f_T = \frac{1}{2\pi RC} \tag{4}$$

Assume that at time $t=t_0$, the cut-off frequency is changed from $f_T$ to $f_T'$ and the input signal can be decomposed into $$V_{in} = \sum_{n=0}^{m} A_n e^{j(\omega_n t + \phi_n)} \tag{5}$$

If $\omega_T$ is assumed to be constant, it can be derived that $$V_{out} = \sum_{n=1}^{m} \left\{ \frac{1}{1 - j\frac{\omega_T}{\omega_n}} A_n e^{j(\omega_n t + \phi_n)} + \frac{V_0}{p(t)} - \frac{A_n e^{j\phi_n}}{p(t)} \cdot \frac{1}{1 - j\frac{\omega_T}{\omega_n}} \right\} \tag{6}$$

In Equation (6), it is evident that the output voltage consists of three components: the desired signal represented by the first term in the bracket; the decaying voltage caused by initial condition of output voltage; and the decaying term caused by the instantaneous input signal level at initial time. Equation (6) shows that frequency switching will introduce other DC offset voltages itself while removing DC offset changes from the input. This switching-induced DC offset is proportional to the input signal amplitude and depends on the signal level at the input and the output at the switching instant. One of the challenges here is to remove this DC offset voltage in a fast and efficient manner so that information can be extracted from the signal.

If the system is in steady state with cut-off frequency of $\omega T$ before it is switched to $\omega T'$ at $t=0$, the output voltage is $$V_{out} = \sum_{n=1}^{m} \left\{ \frac{1}{1 - j\frac{\omega_T'}{\omega_n}} A_n e^{j(\omega_n t + \phi_n)} + \frac{A_n e^{j\phi_n}}{p(t)} \cdot \left( \frac{1}{1 - j\frac{\omega_T'}{\omega_n}} - \frac{1}{1 - j\frac{\omega_T}{\omega_n}} \right) \right\} \tag{7}$$

$$= \sum_{n=1}^{m} \left\{ \frac{1}{1 - j\frac{\omega_T'}{\omega_n}} A_n e^{j(\omega_n t + \phi_n)} + \frac{A_n e^{j\phi_n}}{p(t)} \cdot \left( \frac{j(\omega_T' - \omega_T)/\omega_n}{\left(1 - j\frac{\omega_T'}{\omega_n}\right)\left(1 - j\frac{\omega_T}{\omega_n}\right)} \right) \right\}$$

From Equation (7), it can observe in the second term on the right side that in the frequency switching schemes there is a DC offset that is roughly proportional to the difference of switched frequency. Equation (7) shows that to minimize switching induced DC offset, a smooth and continuous frequency change is highly desirable.

Based on the developed mathematical models, it is therefore desirable to have innovative circuits and methods for continuous frequency-switching to overcome the shortcoming of prior art technologies.

SUMMARY OF THE INVENTION

It is therefore an object of the present invention to provide circuits for DC offset removal with continuous frequency-switching.

It is another object of the present invention to provide continuous variable resistance control circuits for DC offset removal.

It is yet another object of the present invention to provide current controlled continuous, variable resistance control circuits for DC offset removal.

Briefly, a fast-settling DC offset removal circuit with continuous cutoff frequency switching is disclosed. In the preferred embodiment, the circuit is implemented using a pair of RC filters for receiving a differential signal pair and a continuous, variable resistance control circuit. The control circuit can be current-controlled or voltage controlled to provide fast settling of the received signal and the removal of the DC offset components. Additionally, by using a current-controlled variable resistance circuit, the cutoff frequency of the RC filter can be ramped from high to low in a continuous manner, thereby minimizing the generation of DC offsets.

An advantage of the present invention is that it provides circuits for DC offset removal with continuous frequency-switching.

Another advantage of the present invention is that it provides continuous variable resistance control circuits for DC offset removal.

Yet another advantage of the present invention is that it provides current controlled continuous, variable resistance control circuits for DC offset removal.

IN THE DRAWINGS

DETAIL DESCRIPTION OF THE PREFERRED EMBODIMENTS

Figure 1:
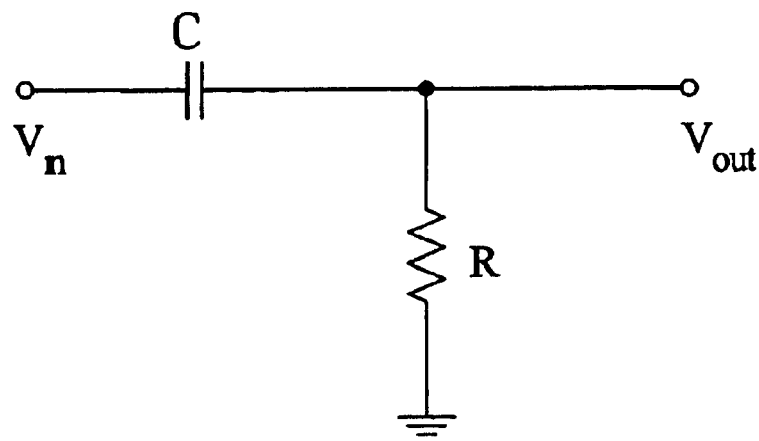
FIG. 1 illustrates a simple RC filter.
Figure 2:
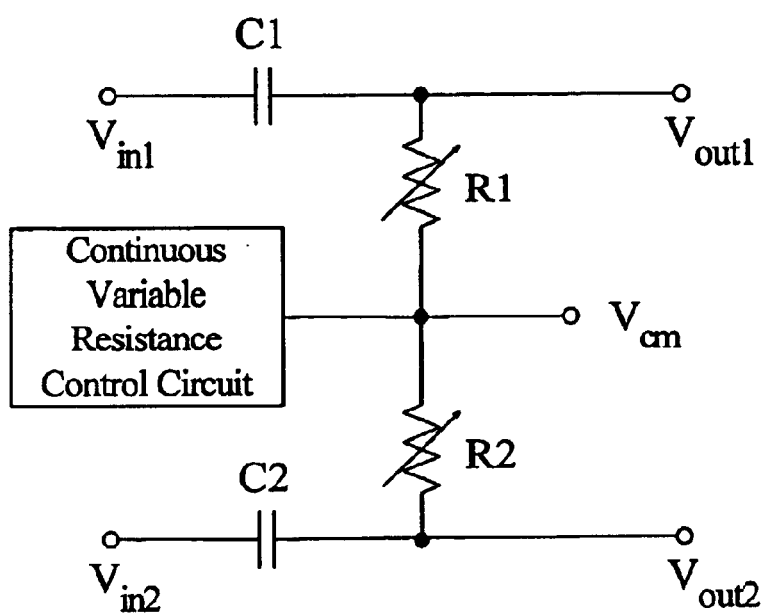
FIG. 2 illustrates a presently preferred embodiment of the present invention of an AC coupling, continuous cut-off frequency switching circuit.

In a presently preferred embodiment of the present invention, referring to FIG. 2, the circuit has a first capacitor having one end connected to a first input node and a second end connected to a first output node, a second capacitor having one end connected to a second input node and a second end connected to a second output node, a first variable resistor having a first end connected to the first output node and a second end connected to a common mode voltage source, $V_{cm}$, a second variable resistor having a first end connected to the second output node and a second end connected to the $V_{cm}$ voltage source, and a continuous variable resistance control circuit connected to the node at the $V_{cm}$ voltage source. The input to this circuit is a differential signal pair, which is quickly settled and the DC offset removed from the differential signal pair.

Figure 3:
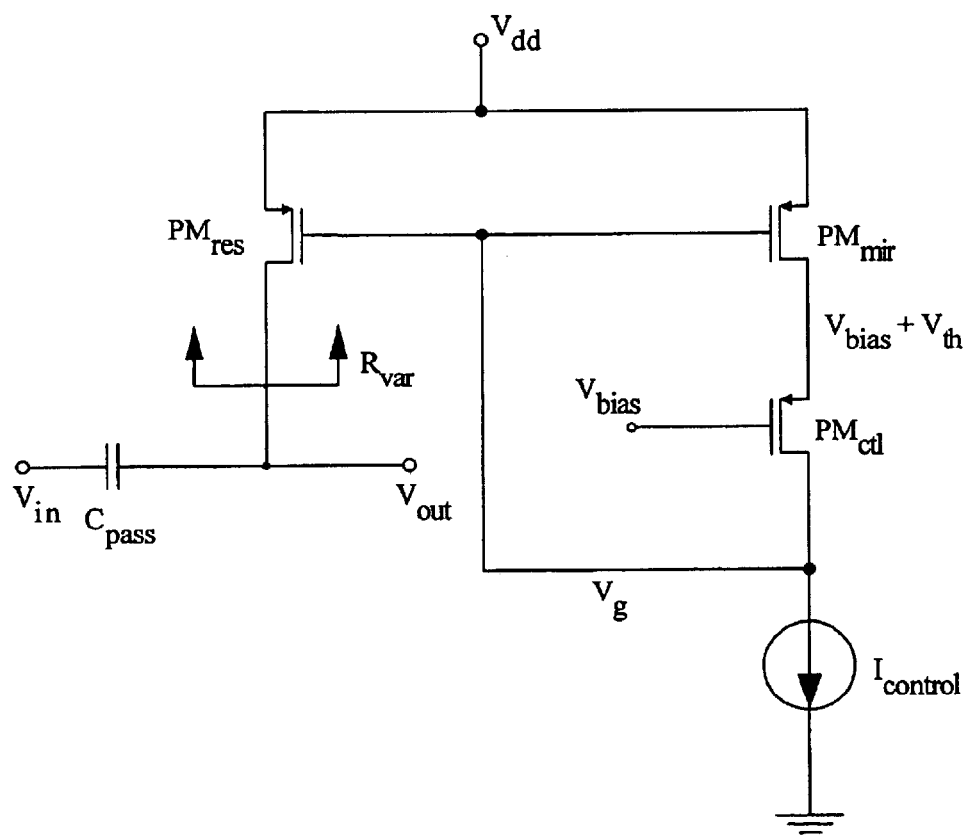
FIG. 3 illustrates a presently preferred embodiment of the current-controlled variable resistor of the preferred embodiment of the present invention.

Referring to FIG. 3, in an aspect of the presently preferred embodiment, a continuous variable resistor using MOS devices for current controlled variable resistance is disclosed. A RC filter with time varying cut-off frequency is constructed. Here, a wide PMOS transistor (in reference to the width and length ratio of the transistor channel), $PM_{ctl}$, works in the saturation region forcing the drain-to-source voltage ($V_{ds}$) of transistor $PM_{mir}$ to be less than its saturation voltage ($V_{dsat}$) and to operate in the linear region. It also stabilizes the $V_{ds}$ of $PM_{mir}$ to be close to $V_{dd}-V_{bias}-V_{th}$, where $V_{th}$ is the threshold voltage of $PM_{ctl}$, and $V_{bias}$ is the supplied bias voltage to set $PM_{mir}$ in the linear region. With its gate self-biased at the drain of $PM_{ctl}$, the channel resistance of $PM_{mir}$ is approximately $$R_{var} \cong \frac{V_{dd} - V_{bias} - V_{th}}{I_{control}} \qquad (8)$$

Since the DC operating voltage of the drain of $PM_{res}$ is typically at $V_{cm}$, it also works in the linear region. Here, $V_{cm}$ equals to $V_{dd}$. The gate of $PM_{res}$ is also tied to $V_g$, as a result, its channel resistance equals to that of $PM_{mir}$, that is, $R_{var}$. In this manner, a variable resistance controlled by current source $I_{control}$ is constructed. By controlling the current source, the cutoff frequency of the RC filter can be ramped from high to low in a continuous manner, thereby avoiding the generation of DC offsets. Note that although a current-controlled circuit is illustrated and explained here, a voltage-controlled circuit can be used as well. In this application, a current-controlled circuit is used over a voltage-controlled circuit because a current-controlled circuit can define variable channel resistance more precisely.

Figure 4:
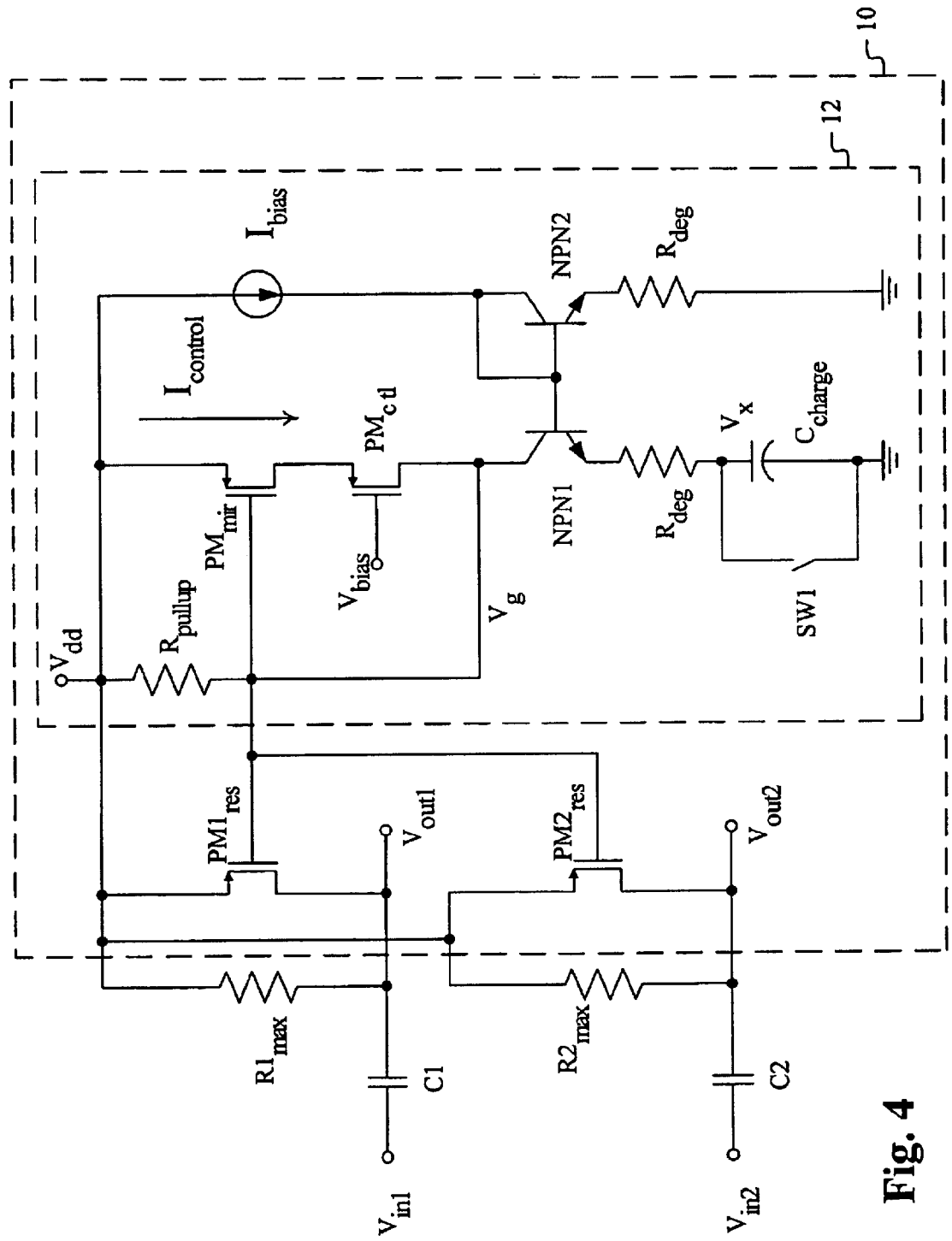
FIG. 4 shows a detailed schematic of the presently preferred embodiment.

In applying the continuous, variable resistance circuit of FIG. 3, FIG. 4 illustrates a detailed embodiment of the circuit of the present invention shown in FIG. 2. Here, a first input node, $V_{in1}$, is connected in series with a first capacitor, C1, then to a first output node, $V_{out1}$; and a second input node, $V_{in2}$, connected in series with a second capacitor, C2, and then to a second output node, $V_{out2}$. Resistors $R1_{max}$ and $R2_{max}$ are connected to their respective output nodes and are used to set the steady state corner frequency at the desired frequency, e.g. 10 KHz. Although they are optional, these fixed resistors are used because it is hard to maintain a precise large resistance value by the variable resistor circuit alone. These resistors are placed in parallel with a continuous, variable resistance control block 10. This control block also performs the function of DC offset removal and the settling of the signal pair. Here, there is a first transistor, $PM1_{res}$, for controlling the resistance provided to the first RC filter for the signal coming from the first input node, $V_{in1}$, and a second transistor, $PM2_{res}$, for controlling the resistance provided to the second RC filter for the signal coming from the second input node.

Control circuit block 12 provides the control signal to generate continuous, variable resistance for the circuit. Similar to FIG. 3, there is a mirroring transistor, $PM_{mir}$, and a control transistor, $PM_{ctl}$. A pull-up resistor, $R_{pullup}$, is inserted to completely turn off the variable resistor circuit after the settling period in order to ensure that the settling circuit has no impact on the characteristics of the high pass RC filters ($R_{max1}$, $R_{max2}$, $C_1$, and $C_2$). The control current generation sub-circuit is implemented by two NPN transistors, NPN1 and NPN2, two degeneration resistors that have resistance value $R_{deg}$, a capacitor, $C_{charge}$ and a switch, SW1. The RC circuit ($R_{deg}$ and $C_{charge}$) is constructed to generate a decreasing current with respect to time.

The operation of the invented circuit is shown graphically by FIGS. 5a–5d. At the start of the settling period, switch SW1 is closed to set $I_{control}$ to its maximum value of $I_{bias}$. Before it is switched open at time instant $t_1$, $V_x$ is 0 and the cut-off frequency is at a high value ($f_{init}$~3 MHz). Transient DC offset from input is settled to 15% of is original value within this period if is approximately 100 nSec. After SW1 is opened at $t_1$, the control current decrease near exponentially with a time constant of $$t_x \approx \frac{1}{R_{deg}C_{charge}}. \qquad (9)$$

Figure 5A:
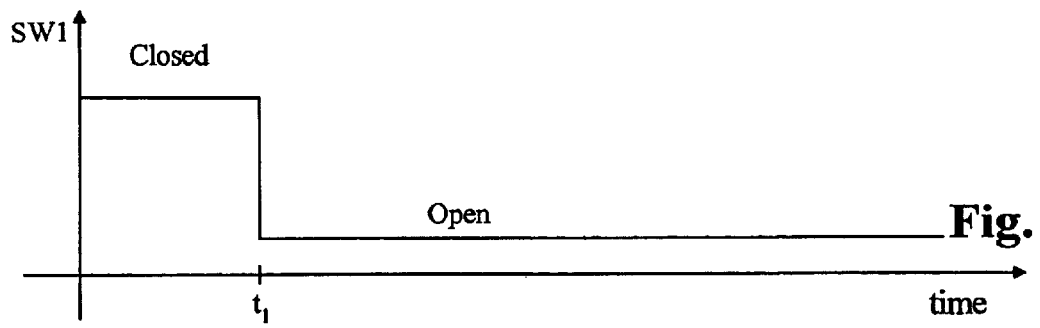
FIGS. 5a–5d illustrate the various states of the variables of the circuit of FIG. 4.
Figure 5B:
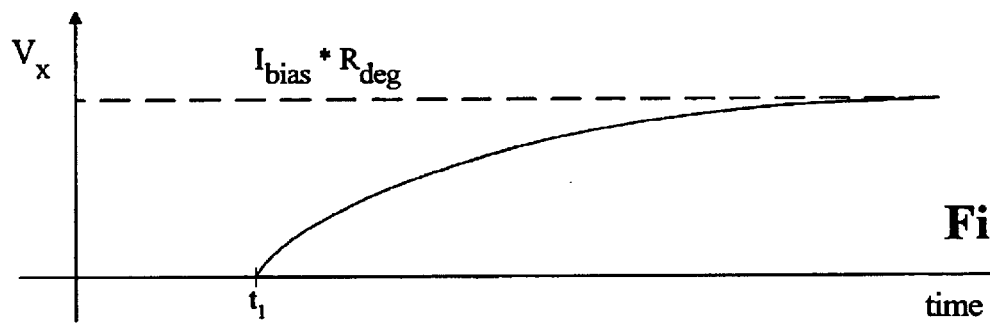
Figure 5C:
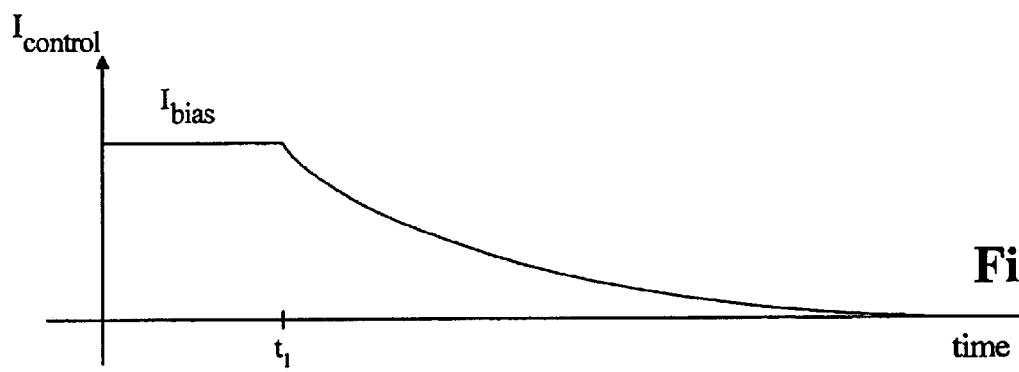
Figure 5D:
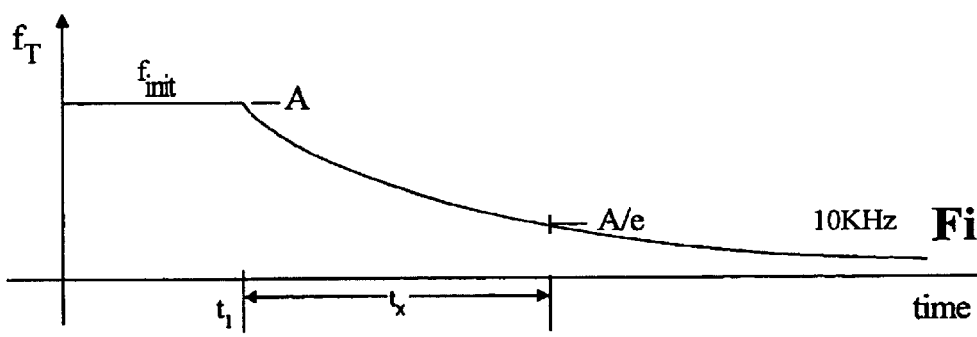

After $SW_1$, is opened, when $V_x$ reaches approximately $R_{deg}*I_{bias}$, $I_{bias}$ decreases to near zero, and cut-off frequency reaches its steady state in accordance with the value of $R1_{max}$ and C1, and $R2_{max}$ and C2. As illustrated by FIG. 5d, $t_x$ is the time period where $f_{init}$ having an amplitude of A decreases to an amplitude of A/e. The settling performance can be estimated using Equation (3), (8), and (9).

Figure 6:
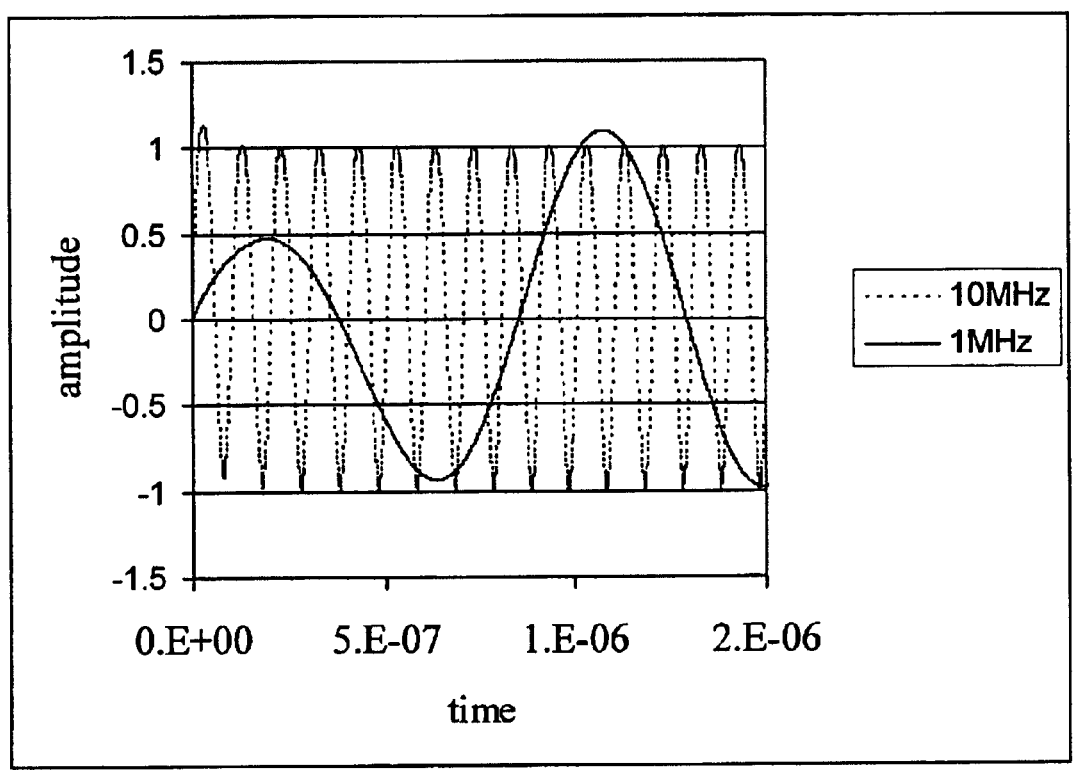
FIG. 6 illustrates the calculated output voltage for signal tone input signals at 1 MHz and 10 MHz with $t_x$=400 ns and $f_{init}$=3.2 MHz.

Because analytical solution cannot be obtained, numerical calculation was done in Microsoft Excel to provide a sample scenario analysis of the operation of this circuit. If $If_{init}$ is about 3.2 MHz and $t_x$ is 400 n second, the original transient DC offset and the switching induced DC offset due to instantaneous output voltage ($V_O$) can be further attenuated by more than 700 times within 700 n second. The calculated output waveforms for two single-tone sine waves with the worst-case initial phase are shown in FIG. 6. From the figure, it is evident that switch-induced DC offset from instantaneous input voltage is less than 10% of signal amplitude within 700 n second.

Other type of devices with variable channel resistance characteristics such NMOS or other types of FET devices can be used as well. Note that with respect to the nodes of a given transistor device, the drain and source nodes may be illustrated in one configuration but may be deemed interchangeable in practice and may suffer performance degradation (especially when interchanging the emitter and collector nodes of BJT devices). Implementation wise, the DC offset removal circuits can be designed and implemented in a 0.35 um SiGe BiCMOS process.

While the present invention has been described with reference to certain preferred embodiments, it is to be understood that the present invention is not to be limited to such specific embodiments. Rather, it is the inventor's contention that the invention be understood and construed in its broadest meaning as reflected by the following claims. Thus, these claims are to be understood as incorporating and not only the preferred embodiment described herein but all those other and further alterations and modifications as would be apparent to those of ordinary skilled in the art.

We claim:

1. A circuit for fast settling of received differential signal pair, comprising:

a first capacitor having a first end connected to a first input node and a second end connected to a first output node;

a second capacitor having a first end connected to a second input node and a second end connected to a second output node;

a first continuously variable resistor having a first end connected to said first output node and a second end connected to a common voltage source;

a second continuously variable resistor having a first end connected to said second output node and a second end connected to said common voltage source; and a control circuit for controlling said first continuously variable resistor and said second continuously variable resistor.

2. A circuit as recited in claim 1 wherein said first variable resistor and said second variable resistor, comprises:

a first resistor having a first end connected to said first output node and a second end connected to a common voltage source;

a first resistance transistor having a first node connected to said first output node, a second node connected to said common voltage source and a gate node;

a second resistor having a first end connected to said second output node and a second end connected to said common voltage source;

a second resistance transistor having a first node connected to said second output node, a second node connected to said common voltage source and a gate node;

a mirror transistor having a first node, a second node connected to said common voltage source, and a gate node connected to said gate node of said first resistance transistor and said gate node of said second resistance transistor;

a control transistor having a first node connected to the gate node of said mirror transistor, a second node connected to said first node of said mirror transistor, and a gate node connected to a bias voltage source; and a control sub-circuit connected to said first node of said control transistor.

3. A circuit as recited in claim 2 wherein said control sub-circuit is current-controlled.

4. A circuit as recited in claim 2 wherein said control sub-circuit is voltage-controlled.

5. A circuit as recited in claim 2 wherein each of the first node of said first resistance transistor, said second resistance transistor, said mirror transistor, and said control transistor is consisted of a drain node or a source node.

6. A circuit as recited in claim 5 wherein each of the second node of said first resistance transistor, said second resistance transistor, said mirror transistor, and said control transistor is consisted of a drain node or a source node.

7. A circuit as recited in claim 3, wherein said current control circuit comprises:

a first current transistor having a emitter node, a collector node connected to said first node of said control transistor, and a base node;

a second current transistor having a emitter node, a collector node connected to a constant current source, and a base node, said base node connected to said collector node and the said base node of the first current transistor;

a first degeneration resistor having a first end connected to said emitter node of said first current transistor, and a second end;

a second degeneration resistor having a first end connected to said emitter node of said second current transistor, and a second end connected to ground;

a charging capacitor having a first end connected to said second end of said first degeneration resistor and a second end connected to ground; and a first switch having a first end connected to said first end of said first degeneration resistor and a second end connected to ground.

8. A circuit for fast settling of received differential signal pair, comprising:
- a first capacitor having a first end connected to a first input node and a second end connected to a first output node;
- a second capacitor having a first end connected to a second input node and a second end connected to a second output node;
- a first resistor having a first end connected to said first output node and a second end connected to a common voltage source;
- a first resistance transistor having a first node connected to said first output node, a second node connected to said common voltage source and a gate node;
- a second resistor having a first end connected to said second output node and a second end connected to said common voltage source;
- a second resistance transistor having a first node connected to said second output node, a second node connected to said common voltage source and a gate node;
- a mirror transistor having a first node, a second node connected to said common voltage source, and a gate node connected to said gate node of said first resistance transistor and said gate node of said second resistance transistor;
- a control transistor having a first node connected to the gate node of said mirror transistor, a second node connected to said first node of said mirror transistor, and a gate node connected to a bias voltage source; and
- a control current generation sub-circuit connected to said first node of the control transistor.

9. A circuit as recited in claim 8 wherein said control sub-circuit is current-controlled.

10. A circuit as recited in claim 8, wherein said current control circuit comprises:
- a first current transistor having a emitter node, a collector node connected to said first node of said control transistor, and a base node;
- a second current transistor having a emitter node, a collector node connected to a constant current source, and a base node, said base node connected to said collector node and the said base node of the first current transistor;
- a first degeneration resistor having a first end connected to said emitter node of said first current transistor, and a second end;
- a second degeneration resistor having a first end connected to said emitter node of said second current transistor, and a second end connected to ground;
- a charging capacitor having a first end connected to said second end of said first degeneration resistor and a second end connected to ground; and
- a first switch having a first end connected to said first end of said first degeneration resistor and a second end connected to ground.

11. A circuit as recited in claim 8 wherein each of the first node of said first resistance transistor, said second resistance transistor, said mirror transistor, and said control transistor is consisted of a drain node or a source node.

12. A circuit as recited in claim 11 wherein each of the second node of said first resistance transistor, said second resistance transistor, said mirror transistor, and said control transistor is consisted of a drain node or a source node.

* * * * *